(12) United States Patent
Mok et al.

(10) Patent No.: US 7,973,248 B2
(45) Date of Patent: Jul. 5, 2011

(54) PRINTED CIRCUIT BOARD USING PASTE BUMP AND MANUFACTURING METHOD THEREOF

(75) Inventors: Jee-Soo Mok, Yongin-si (KR);
Chang-Sup Ryu, Yongin-si (KR);
Eung-Suek Lee, Ansan-si (KR);
Youn-Soo Seo, Suwon-si (KR);
Hee-Bum Shin, Gunpo-si (KR); Yoong Oh, Suwon-si (KR); Byung-Bae Seo, Eumseong-gun (KR); Tae-Kyoung Kim, Anyang-si (KR); Dong-Jin Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/219,381

(22) Filed: Jul. 21, 2008

(65) Prior Publication Data

US 2008/0283288 A1    Nov. 20, 2008

Related U.S. Application Data

(62) Division of application No. 11/598,140, filed on Nov. 13, 2006, now abandoned.

(30) Foreign Application Priority Data

Nov. 16, 2005  (KR) .................. 10-2005-0109850
Nov. 16, 2005  (KR) .................. 10-2005-0109855

(51) Int. Cl.
*H01R 12/04* (2006.01)
*H05K 1/11* (2006.01)

(52) U.S. Cl. ........ 174/264; 174/262; 174/266; 361/792; 361/795

(58) Field of Classification Search .................. 174/264, 174/262, 266; 361/760, 792, 795
See application file for complete search history.

(56) References Cited

U.S. PATENT DOCUMENTS 5,121,299 A * 6/1992 Frankeny et al. ............. 361/785
(Continued)

FOREIGN PATENT DOCUMENTS

JP     11-87912     3/1999
(Continued)

OTHER PUBLICATIONS

U.S. Appl. No. 11/598,140, filed Nov. 13, 2006, Jee-Soo Mok, Samsung Electro-Mechanics Co., Ltd.
(Continued)

*Primary Examiner* — Yuriy Semenenko
*Assistant Examiner* — Andargie M Aychillhum

(57) ABSTRACT

A printed circuit board using paste bumps and manufacturing method thereof are disclosed. The method of manufacturing a printed circuit board using paste bumps, includes: (a) perforating a core board to form at least one via hole, (b) filling the at least one via hole by fill-plating and forming a circuit pattern on at least one surface of the core board, (c) stacking a paste bump board on at least one surface of the core board, and (d) forming an outer layer circuit on a surface of the paste bump board, a structurally stable all-layer IVH structure can be implemented due to increased strength in the BVH's of the plated core boards, the manufacture time can be reduced due to parallel processes and collective stacking, implementing micro circuits can be made easy due to the copper foils of the paste bump boards stacked on the outermost layers, the manufacture costs can be reduced as certain plating and drilling processes may be omitted, the interlayer connection area is increased between circuit patterns for improved connection reliability, and dimple coverage can be obtained.

7 Claims, 13 Drawing Sheets

U.S. PATENT DOCUMENTS

| | | | |
|---|---|---|---|
| 6,320,136 B1 * | 11/2001 | Sakamoto | 174/255 |
| 6,586,686 B1 * | 7/2003 | Enomoto et al. | 174/262 |
| 6,972,383 B2 * | 12/2005 | Akama | 174/264 |
| 7,100,276 B2 * | 9/2006 | Fukuoka et al. | 29/830 |
| 2005/0039948 A1 * | 2/2005 | Asai et al. | 174/262 |
| 2007/0271783 A1 * | 11/2007 | Ikeda | 29/852 |

FOREIGN PATENT DOCUMENTS

| | | |
|---|---|---|
| JP | 2001-189561 | 7/2001 |
| JP | 2002-009441 | 1/2002 |
| JP | 2002-9442 | 1/2002 |
| JP | 2004-186354 | 7/2004 |

OTHER PUBLICATIONS

Korean Patent Office Action, mailed Nov. 15, 2006, and issued in priority Korean Patent Application No. 10-2005-0109850.

Korean Patent Office Action, mailed Nov. 15, 2006, and issued in priority Korean Patent Application No. 10-2005-010855.

Japanese Office Action issued on Nov. 13, 2008 in corresponding Japanese Patent Application 2006-303279.

Chinese Office Action issued on Jan. 9, 2009 in corresponding Chinese Patent Application 200610145418.7.

U.S. Appl. No. 11/598,140, filed Nov. 13, 2006, Jee-Soo Mok, Samsung Electronics Co., Ltd.

U.S. Appl. No. 12/289,534, filed Oct. 29, 2008, Jee-Soo Mok, Samsung Electronics Co., Ltd.

Office Action dated Jun. 20, 2008 issued for U.S. Appl. No. 11/598,140.

Office Action dated Sep. 4, 2008 issued for U.S. Appl. No. 11/598,140.

* cited by examiner

FIG. 8
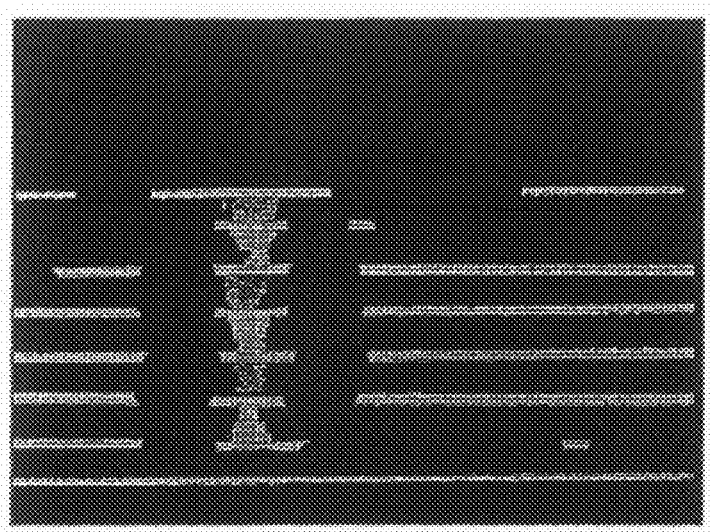
(a)
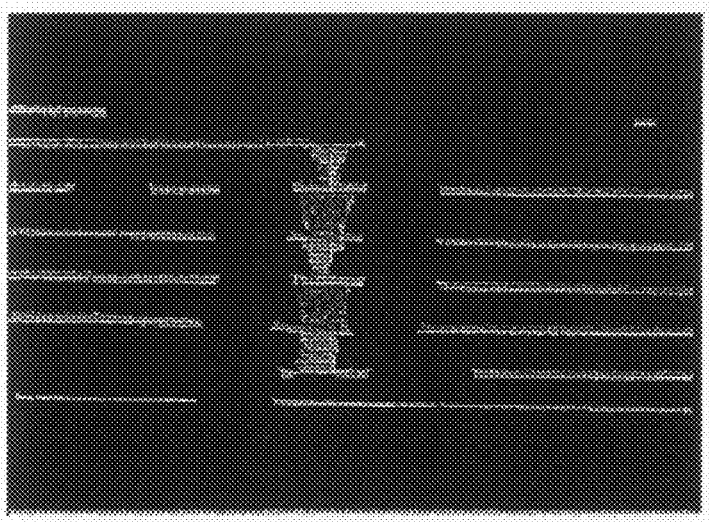
(b)
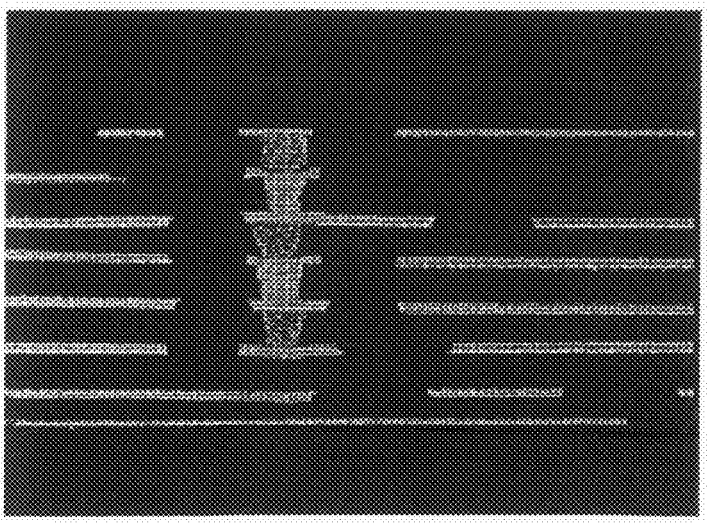
(c)

FIG. 9
(a)
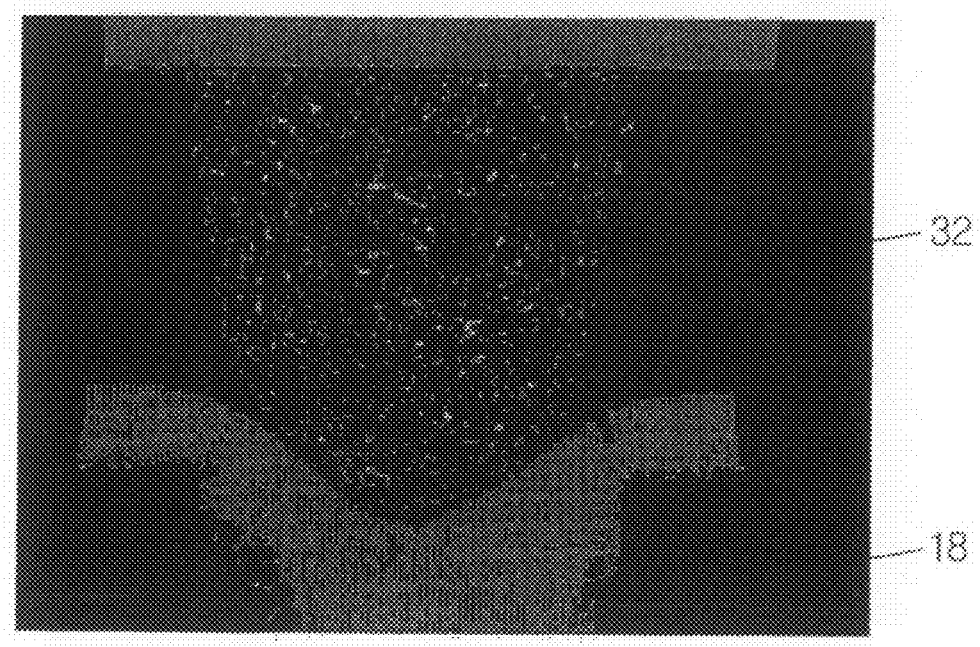
(b)

PRINTED CIRCUIT BOARD USING PASTE BUMP AND MANUFACTURING METHOD THEREOF

CROSS-REFERENCE TO RELATED APPLICATIONS

This application is a U.S. divisional application filed under 35 USC 1.53(b) claiming benefit of U.S. Ser. No. 11/598,140, now abandoned, filed in the United States on Nov. 13, 2006, which claims earlier benefit of Korean Patent Application No. 10-2005-0109850 and Korean Patent Application No. 10-2005-0109855, both filed with the Korean Intellectual Property Office on Nov. 16, 2005, all of which are incorporated herein by reference in their entirety.

BACKGROUND OF THE INVENTION

1. Field of the Invention

The present invention relates to a printed circuit board, and in particular, to a printed circuit board using paste bumps and a manufacturing method thereof.

2. Description of the Related Art

The conventional multilayer printed circuit board is manufactured by forming inner layer circuits on the surface of a core board, such as a copper clad laminate (CCL), etc., through the application of an additive process or a subtractive process, etc., and by forming outer layer circuits through the stacking of insulation layers and metal layers in order, by the same method as for the inner layer circuits.

During the manufacturing process of a multilayer printed circuit board, various via holes are formed, such as IVH's (interstitial via holes), BVH's (blind via holes), and PTH's (plated through holes), etc., for electrical connection between the circuit patterns of each layer and between a circuit pattern and an electronic element. Among these, the PTH's, which are formed penetrating the entire thickness in the cross section of a board, also function as heat-releasing holes, in addition to the function of electrical connection mentioned above.

With developments in electronic components, there is a demand for technology which can improve the performance of HDI (high density interconnection) boards, to which the concepts of interlayer electrical connection and micro circuit wiring have been applied for higher density printed circuit boards. That is, to improve the performance of HDI boards, a technology is required which provides interlayer electrical connection and an adequate degree of freedom.

The method of manufacturing a multilayer printed circuit board according to prior art includes first perforating via holes (e.g. IVH's, etc.) in a core board (e.g. a CCL, etc.) by mechanical drilling, etc., forming plating layers (e.g. by chemical copper plating and/or copper electroplating, etc.) on the surfaces of the core board and on the inner perimeters of the via holes, filling the inside spaces of the IVH's and polishing the surfaces, and then forming inner layer circuits on the surfaces of the core board by applying an additive or a subtractive process, etc., and inspecting the circuits.

Next, a build-up process is performed by procedures of surface treatment and stacking RCC (resin coated copper), etc., and via holes are formed for interlayer electrical connection between circuit patterns by laser drilling, etc., after which outer layer circuits are formed on the surface of the stacked board and the circuits are inspected. To add more layers of circuit patterns, the process is repeated of surface treatment and stacking RCC, etc., forming via holes, plating the surfaces of the via holes, and afterwards forming outer layer circuits. Such a build-up process is repeated to form a desired number of circuit pattern layers.

That is, metal layers are formed after stacking insulation material, or insulation material that has a metal layer formed on its surface (e.g. RCC, etc.) is stacked, on the surfaces of a core board, after which BVH's are processed by laser drilling, etc., for electrical connection between metal layers and inner layer circuits, PTH's which penetrate the entire cross section of the printed circuit board are perforated by mechanical drilling, etc., outer layer circuit layers are formed on the surfaces of the insulation material by the same method as for the inner layer circuits, and the inner perimeters of the PTH's are plated so that the PTH's function as heat-releasing holes.

However, the conventional manufacturing process for multilayer printed circuit boards is unable to comply to requests for low costs according to lowering prices in the applied products (e.g. cell phones, etc.) and requests for reduced lead times for increased productivity, and thus there is a demand for a new manufacturing process that can resolve such problems.

Also, the conventional method requires a plating process which is complicated, expensive, and time-consuming, and does not provide a sufficient heat-releasing effect through the PTH's. Also, when forming circuit patterns after forming the plating layer, the conventional method presents difficulties in forming micro circuits, caused by the increase in thickness of the circuit patterns due to the plating layer.

Meanwhile, in order to simplify the complicated process of prior art and to manufacture a multilayer printed circuit quickly and inexpensively by a collective stacking procedure, the so-called "B2IT (buried bump interconnection technology)" has been commercialized, which allows a simple and convenient stacking process by printing paste on a copper foil 3 to form bumps 2' and stacking an insulation material 1 thereon to prefabricate a paste bump board, as illustrated in FIG. 1.

Prior art related to the paste bump board includes an invention which uses a paste bump board having bumps made of conductive paste formed on a copper foil to allow simple and easy interconnection between the terminals of high-density electronic components. This invention, however, implements all-layer IVH's with only the paste bump board so that it has a weak structure. Also, there is a likelihood of short circuits occurring in a high-voltage, high-frequency environment, and there are paste bumps filled in the board's via holes so that the properties of heat release through PTH's have not been improved.

SUMMARY OF THE INVENTION

The present invention aims to provide a printed circuit board and a manufacturing method thereof, with which a multilayer printed circuit board is formed by collectively stacking a core board having plated BVH's, a board having paste bumps printed on a core board, and a paste bump board, to implement a structurally stable all-layer IVH structure, improve the connection reliability by means of an increase in interlayer connection area, and reduce lead times.

Another object of the present invention is to provide a printed circuit board using paste bumps and a manufacturing method thereof, for which paste bump boards are stacked on a core board and paste bumps are filled in heat-releasing holes, such that the heat-releasing effect is improved.

One aspect of the present invention provides a method of manufacturing a printed circuit board using paste bumps, comprising: (a) perforating a core board to form at least one via hole, (b) filling the at least one via hole by fill-plating and forming a circuit pattern on at least one surface of the core board, (c) stacking a paste bump board on at least one surface of the core board, and (d) forming an outer layer circuit on a surface of the paste bump board.

It may be preferable that the core board be a copper clad laminate (CCL), which has a copper foil layer stacked on its surface. In certain embodiments, the method may further include an operation of removing the copper foil layer in correspondence with a position where the at least one via hole is to be formed, before the operation (a) of perforating a core board to form at least one via hole. The method may also further include an operation of reducing the thickness of the copper foil layer by half-etching, between the operation (a) of perforating a core board to form at least one via hole and the operation (b) of filling the at least one via hole by fill-plating and forming a circuit pattern on at least one surface of the core board. The via hole may preferably be a blind via hole (BVH).

Preferably, the paste bump board may be formed by (e) printing at least one paste bump on a copper foil, (f) setting the at least one paste bump, and (g) stacking an insulation material on the copper foil such that the at least one paste bump penetrates the insulation material.

A plating layer, formed by the fill-plating in the at least one via hole, may preferably comprise a dimple, with the at least one paste bump formed in correspondence with a position of the dimple. The strength of the paste bump may preferably be lower than that of the plating layer and greater than that of the insulation material. The paste bump may include silver paste.

In certain embodiments, the method may further include an operation of pressing the paste bump board onto the core board, between the operation (c) of stacking a paste bump board on at least one surface of the core board and the operation (d) of forming an outer layer circuit on a surface of the paste bump board.

Another aspect of the invention provides a method of manufacturing a printed circuit board using paste bumps by collectively stacking at least one first core board, at least one second core board, and at least one outer layer board, in which the first core board is formed by (a) forming at least one BVH (blind via hole) on one surface of a core member, and (b) filling the at least one BVH by fill-plating and forming a circuit pattern on at least one surface of the core member; the second core board is formed by (c) joining at least one core bump onto the other surface of the core member of the first core board in a position where the at least one BVH is formed, (d) setting the at least one core bump, and (e) stacking a core insulation material on the other surface of the core member such that the at least one core bump penetrates the core insulation material; while the outer layer board is formed by (f) joining at least one outer layer bump onto a copper foil, (g) setting the at least one outer layer bump, and (h) stacking an outer layer insulation material on the copper foil such that the at least one outer layer bump penetrates the outer layer insulation material.

The core member may preferably be a copper clad laminate (CCL), which has a copper foil layer stacked on its surface. In certain embodiments, the method may further include an operation of removing the copper foil layer in correspondence with a position where the BVH is to be formed, before the operation (a) of forming at least one BVH on one surface of a core member. The method may also further include an operation of reducing the thickness of the copper foil layer by half-etching, between the operation (a) of forming at least one BVH on one surface of a core member and the operation (b) of filling the at least one BVH by fill-plating and forming a circuit pattern on at least one surface of the core member.

The at least one core bump or the at least one outer layer bump may be formed by printing silver paste. It may be preferable for a plating layer, formed by the fill-plating in the at least one BVH, to comprise a dimple, while the at least one core bump or the at least one outer layer bump may be formed in correspondence with a position of the dimple.

The printed circuit board may be formed by aligning and stacking a plurality of the first core boards or a plurality of the second core boards such that the at least one core bump or the at least one outer layer bump is in correspondence with a position of the dimple, and afterwards pressing the at least one outer layer board.

Still another aspect of the invention provides a printed circuit board using paste bumps, comprising: a core board, a BVH (blind via hole) formed in the core board, a plating layer filled in the BVH, a circuit pattern formed on at least one surface of the core board, a dimple included in the plating layer, and a paste bump board stacked on the core board, in which the paste bump board is formed by joining at least one paste bump onto a copper foil and stacking an insulation material on the copper foil such that the at least one paste bump penetrates the insulation material.

The core board may preferably be a copper clad laminate (CCL), which has a copper foil layer stacked on its surface. It may be preferable that the at least one paste bump be joined in correspondence with a position of the dimple. It may also be preferable that the at least one paste bump be filled in the dimple and be electrically connected with the plating layer. It may also be preferable that the paste bump have a strength lower than that of the plating layer and greater than that of the insulation material. The printed circuit board may further comprise an outer layer circuit formed by removing portions of the copper foil.

Meanwhile, the printed circuit board may further comprise an extra board positioned between the core board and the paste bump board, while the extra board may comprise an extra BVH (blind via hole) formed on one surface of the extra board, an extra plating layer filled in the extra BVH, an extra circuit pattern-formed on at least one surface of the extra board, an extra dimple included in the extra plating layer, and an extra bump joined to the other side of the extra board in a position where the extra BVH is formed, where it may be preferable that the extra bump be filled in the dimple and be electrically connected with the plating layer, and that the paste bump be filled in the extra dimple and be electrically connected with the extra plating layer.

The paste bump, the extra plating layer, and the plating layer may form an all-layer IVH (interstitial via hole).

Yet another aspect of the invention provides a method of manufacturing a printed circuit board using paste bumps, comprising: (a) perforating a core board to form at least one via hole, (b) forming an inner layer circuit on at least one surface of the core board, (c) stacking a paste bump board on at least one surface of the core board, and (d) forming an outer layer circuit on a surface of the paste bump board.

The core board may preferably be a copper clad laminate (CCL), and the operation (a) of perforating a core board to form at least one via hole may preferably comprise perforating the at least one via hole by mechanical drilling. The operation (a) of perforating a core board to form at least one via hole further may further comprise forming a plating layer on an inner perimeter of the at least one via hole.

It may be preferable for the paste bump board to be formed by (e) printing at least one paste bump on a copper foil in correspondence with a position where the at least one via hole is formed, and (f) setting the at least one paste bump. The method may further comprise an operation of stacking an insulation material on the copper foil such that the at least one paste bump penetrates the insulation material, after the operation (f) of setting the at least one paste bump.

The at least one paste bump may include silver paste. It may be preferable that the amount of the at least one paste bump be determined in correspondence with a size of the at least one via hole such that the at least one via hole is filled. Preferably, the paste bump may have a strength lower than that of the plating layer and greater than that of the insulation material. It may be preferable that the paste bump be formed in a shape of a BVH (blind via hole) which electrically connects the inner layer circuit and the outer layer circuit.

The operation (c) of stacking a paste bump board on at least one surface of the core board may include an operation of stacking the paste bump board on both surfaces of the core board. Also, an operation of pressing the paste bump board on both surfaces of the core board may further be included between the operation (c) of stacking a paste bump board on at least one surface of the core board and the operation (d) of forming an outer layer circuit on a surface of the paste bump board.

Still another aspect of the invention provides a printed circuit board using paste bumps, comprising: a core board, a via hole formed by perforating a portion of the core board, an inner layer circuit formed on at least one surface of the core board, a paste bump board formed by joining at least one paste bump on a copper foil layer and stacking an insulation material and stacked on a surface of the core board, and an outer layer circuit formed on a surface of the paste bump board, in which the at least one paste bump is joined in correspondence with a position of the via hole, and the via hole is filled by the at least one paste bump.

The core board may preferably be a copper clad laminate (CCL). A plating layer may be formed on an inner perimeter of the via hole. It may be preferable that the plating layer have varying thickness along its depth from the opening of the via hole, such that the via hole is formed in a shape corresponding with a shape of the at least one paste bump. Also, it may be preferable for the thickness of the plating layer to increase along its depth from the opening of the via hole.

The paste bump board may preferably be formed by printing at least one paste bump on a copper foil, setting the at least one paste bump, and afterwards stacking an insulation material on the copper foil such that the at least one paste bump penetrates the insulation material.

The paste bump may include silver paste. Preferably, the amount of the paste bump may be determined in correspondence with the size of the via hole. It may also be preferable that the paste bump have a strength lower than that of the plating layer and greater than that of the insulation material.

It may be preferable that the paste bump be formed in the shape of a BVH (blind via hole) which electrically connects the inner layer circuit and the outer layer circuit. It may also be preferable that the paste bump board be stacked on both surfaces of the core board.

Additional aspects and advantages of the present invention will be set forth in part in the description which follows, and in part will be obvious from the description, or may be learned by practice of the invention.

THE BRIEF DESCRIPTION OF THE DRAWINGS

Figure 1:
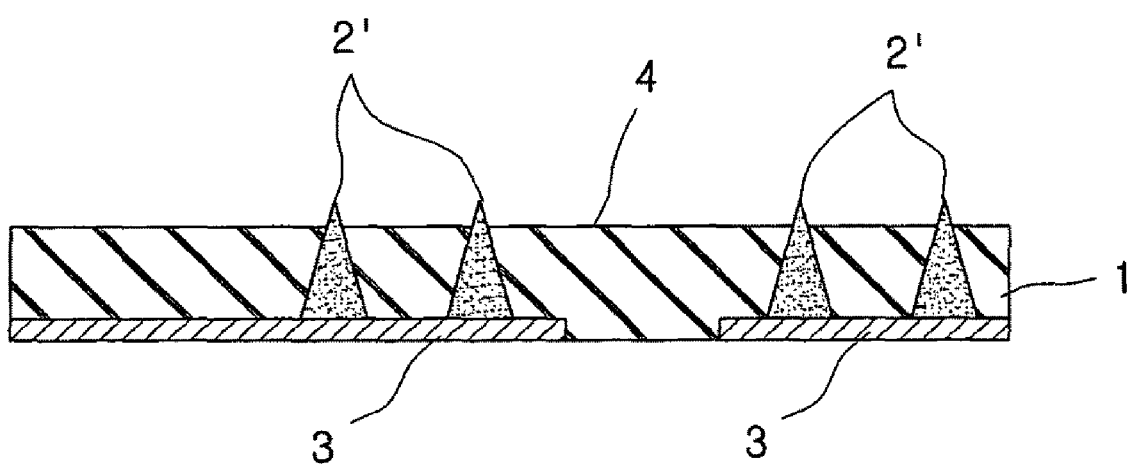
FIG. 1 is a cross-sectional view of a paste bump board according to prior art.

FIG. 4a1-a6, FIG. 4b1-fb3, FIG. 4c1-4c3 and FIG. 4d-4e are flow diagrams illustrating a process of manufacturing a printed circuit board using paste bumps according to an embodiment of the present invention.

Figure 5:
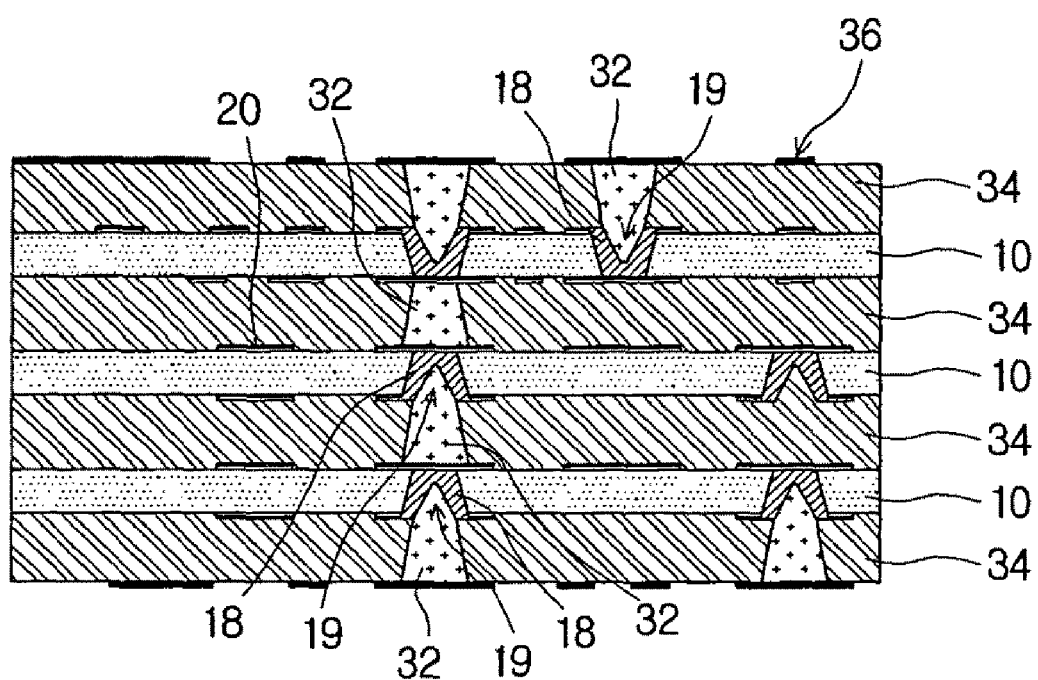

FIG. 5 is a cross-sectional view of a printed circuit board using paste bumps according to an embodiment of the present invention.

FIG. 6a-6b shows cross-sectional views comparing the respective structural stability of a printed circuit board using paste bumps according to an embodiment of the present invention and a printed circuit board using paste bumps according to prior art.

FIG. 7a-7c shows photographs illustrating all-layer IVH structures of a printed circuit board using paste bumps according to an embodiment of the present invention.

FIG. 8a-8c shows photographs illustrating all-layer IVH structures of a printed circuit board using paste bumps according to another embodiment of the present invention.

FIG. 9a-9b shows photographs illustrating dimple coverage in a printed circuit board using paste bumps according to an embodiment of the present invention.

Figure 10:
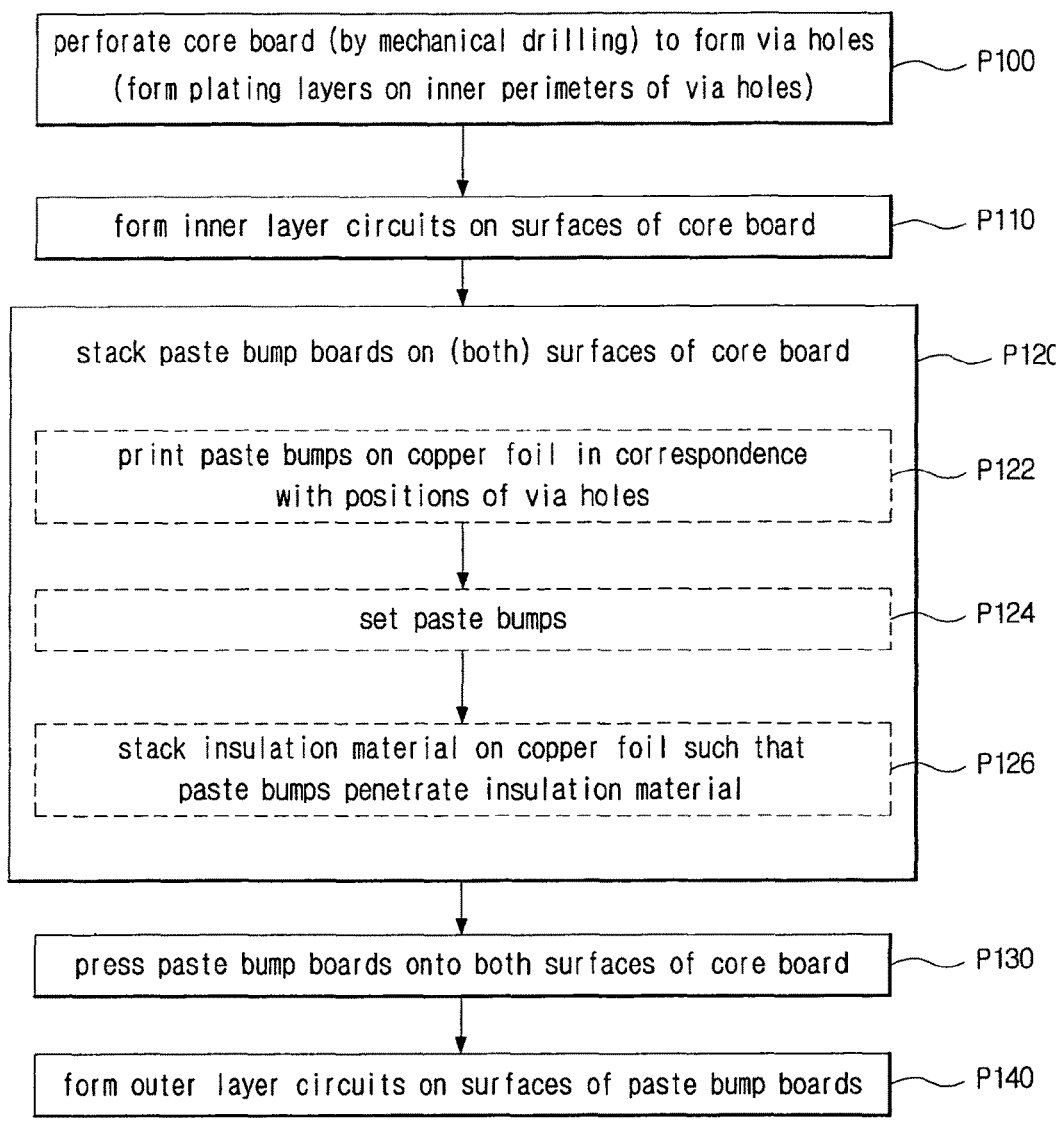

FIG. 10 is a flowchart illustrating a method of manufacturing a printed circuit board using paste bumps according to another embodiment of the present invention.

FIG. 11a1-11a4, FIG. 11b1-11b3 and FIG. 11c-11e are flow diagrams illustrating a process of manufacturing a printed circuit board using paste bumps according to another embodiment of the present invention.

Figure 12:
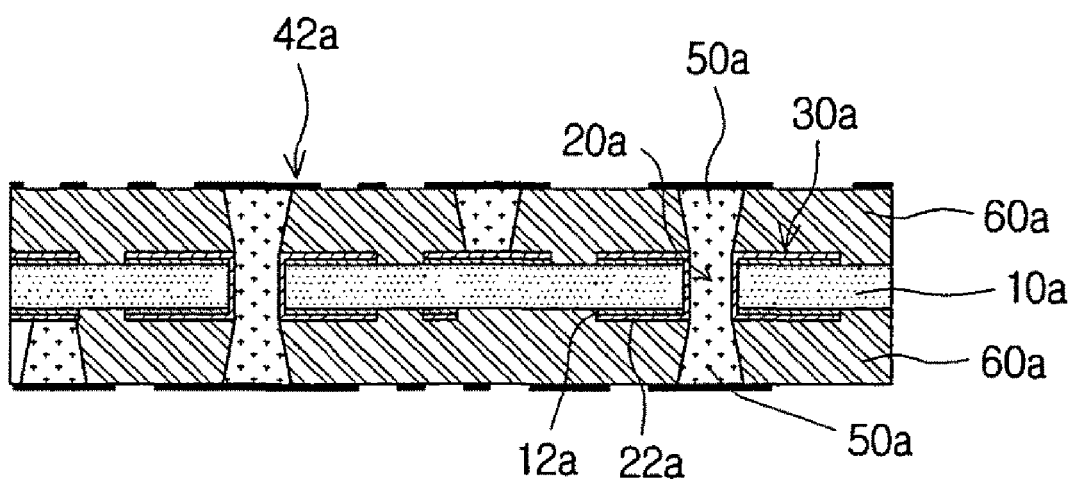

FIG. 12 is a cross-sectional view of a printed circuit board using paste bumps according to another embodiment of the present invention.

Figure 13:
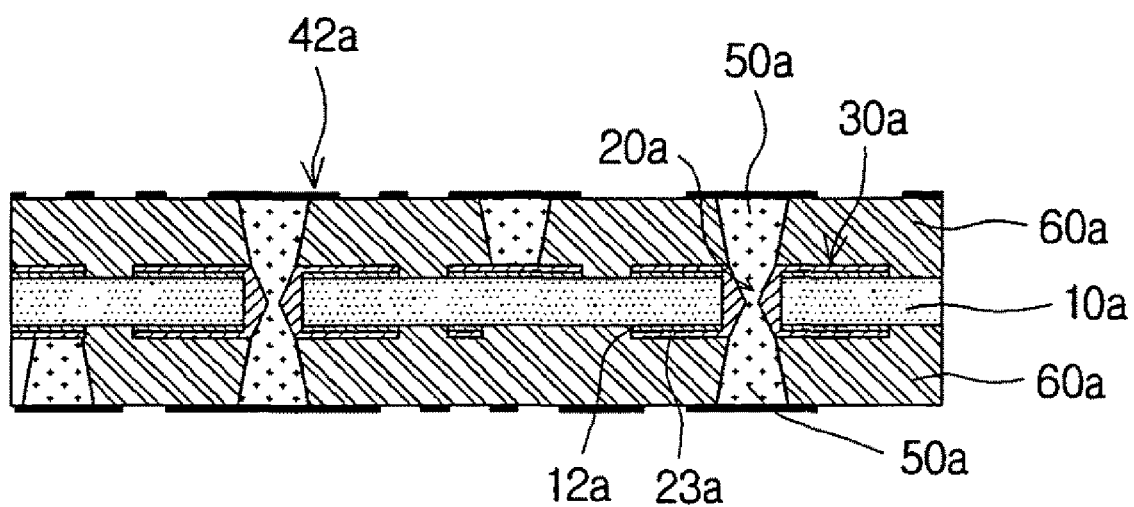

FIG. 13 is a cross-sectional view of a printed circuit board using paste bumps according to another embodiment of the present invention.

DETAILED DESCRIPTION OF THE PREFERRED EMBODIMENTS

Embodiments of the printed circuit board using paste bumps and manufacturing method thereof, according to aspects of the invention, will be described below in more detail with reference to the accompanying drawings. In the description with reference to the accompanying drawings, those components are rendered the same reference number that are the same or are in correspondence regardless of the figure number, and redundant explanations are omitted.

Figure 2:
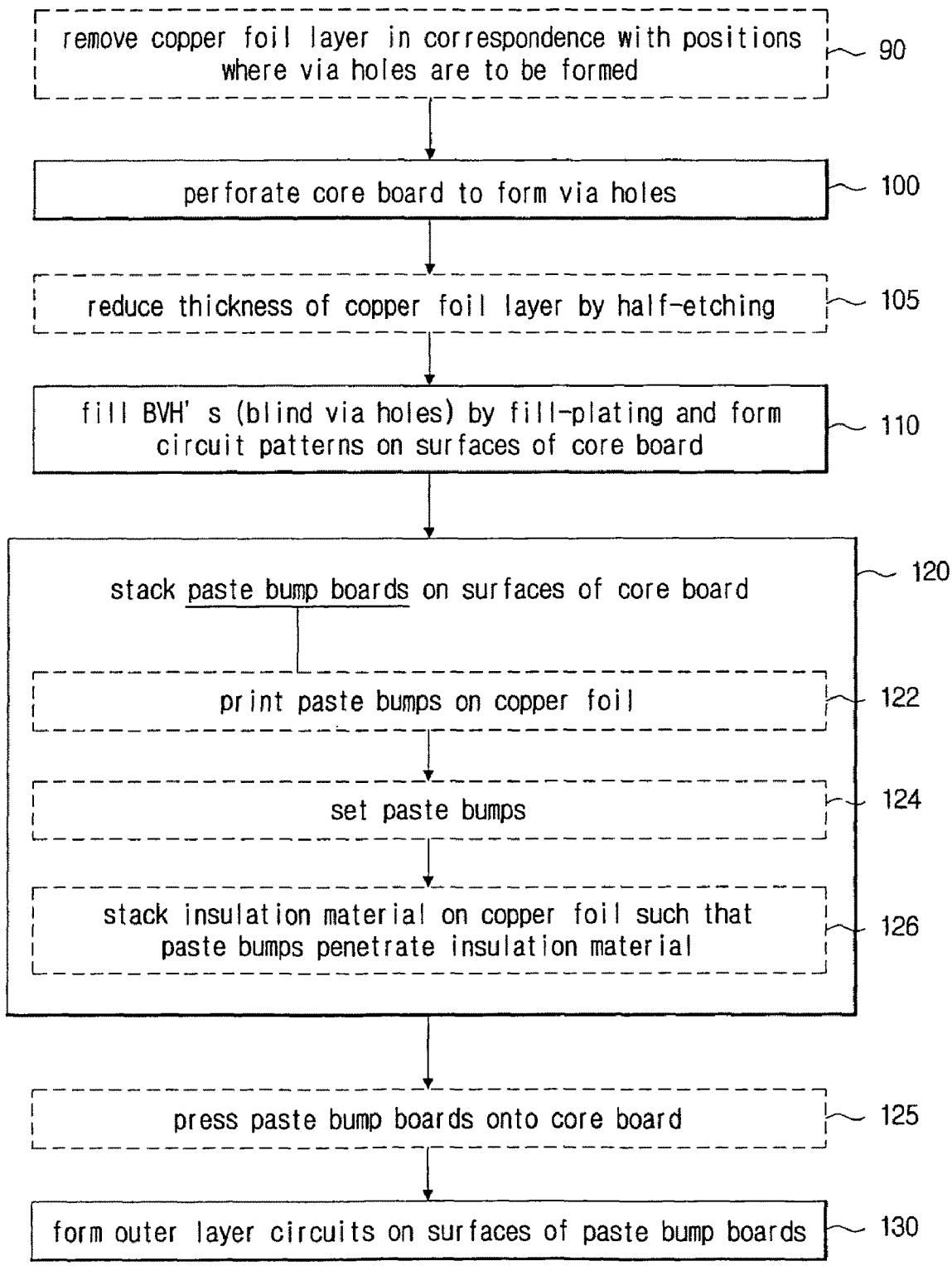
FIG. 2 is a flowchart illustrating a method of manufacturing a printed circuit board using paste bumps according to an embodiment of the present invention.

FIG. 2 is a flowchart illustrating a method of manufacturing a printed circuit board using paste bumps according to an embodiment of the present invention.

The present invention is for reducing the manufacture costs and times of a multilayer printed circuit board by collectively stacking paste bump boards on a core board, where a paste bump board is formed by performing plating on BVH's (blind via holes) formed in a core board, printing paste bumps on a copper foil in correspondence with the positions of the BVH's, and then stacking an insulation material. To this end, first, via holes are formed by perforating the core board (100).

For the core board, it is generally efficient to use a copper clad laminate (CCL), which has a copper foil layer stacked on its surface, as it is effective in forming circuit patterns. Meanwhile, although the present embodiment is described using BVH's as an example, the via holes according to the present invention are not necessarily limited to BVH's.

When a copper clad laminate is used for the core board, it is advantageous to remove the copper foil layer in the corresponding portions (90) and form window portions for forming BVH's, before removing portions of the core board to form BVH's.

Next, the surface of each of the BVH's is fill-plated to form a plating layer, and a circuit pattern is formed on the surface of the core board (110). When fill-plating is performed on a typical BVH, the plating does not result in a flat surface, but rather forms a particular concave, i.e. a dimple is formed. However, the present invention is not necessarily limited to cases in which a dimple is formed in the plating layer, and it is apparent to those skilled in the art that the invention can be applied to cases in which the surface is made flat by the plating, without the forming of a dimple.

Since, during the plating of the BVH's, the plating layer is formed also on the surface of the core board, the thickness of the copper foil layer formed on the surface of the core board is increased, which presents difficulties in forming minute circuit patterns on the surface of the core board. Therefore, by reducing the thickness of the copper foil layer on the surface of the core board to a certain level by means of half-etching (105), before performing the plating in the BVH's, the thickness of the plating layer on the core board surface need not be increased, and a circuit pattern may be formed in a required degree of precision.

Next, paste bump boards are stacked on the surfaces of the core board (120). A paste bump board is formed by printing paste bumps on the surface of a copper foil (122) and setting the printed paste bumps (124).

By thus manufacturing the paste bump boards separately and collectively stacking onto the core board, the manufacturing process for the printed circuit board may be reduced. To make the collective stacking process more efficient, insulation material is stacked onto the copper foil on which paste bumps are formed (126).

As stacking the paste bump boards on the core board is to allow the paste bumps to be electrically connected with the plating layer formed in the BVH's, it is advantageous for the thickness of the insulation material stacked on the copper foil to be less than the height of the paste bumps, so that the ends of the paste bumps are exposed through the surface of the insulation material.

The paste bumps, printed on the copper foil and set, desirably has a strength lower than that of the plating layer on the core board and greater than that of the insulation material. Thus, when the insulation material is stacked on the copper foil, the paste bumps are not deformed but instead penetrate the insulation material to be exposed through the surface of the insulation material.

Also, in order to prevent the damaging of the plating layer by the paste bumps during the process of stacking and pressing the paste bump boards onto the core board to electrically connect the paste bumps and the plating layer, it is desirable that the strength of the paste bumps be lower than that of the plating layer on the core board.

In the process of stacking the paste bump boards on the core board, when the positions of the paste bumps are aligned with the positions of the BVH's, and the paste bump boards are pressed onto the core board (125), the paste bumps are deformed into the shape of the dimples in the plating layer mentioned above, to fill in the dimples. Thus, the paste bumps and the plating layer of the core board are attached and are electrically connected.

While silver paste is typically used as the material for the paste bumps, other types of paste may obviously be used, within a scope apparent to those skilled in the art, in consideration of the strength, cost, and applicability, etc., of the paste.

Lastly, outer layer circuits are formed on the surfaces of the paste bump boards (130) to complete the multilayer printed circuit board. The surface of a paste bump board, on which an outer layer circuit is formed, corresponds to the copper foil described above. Since such processes as BVH drilling and plating, etc., for forming outer layer circuits are not required, the problem in prior art of increased thickness of the copper foil layer caused by stacking RCC, etc., and plating may be avoided, whereby micro circuit patterns may readily be formed in implementing outer layer circuits.

Figure 3:
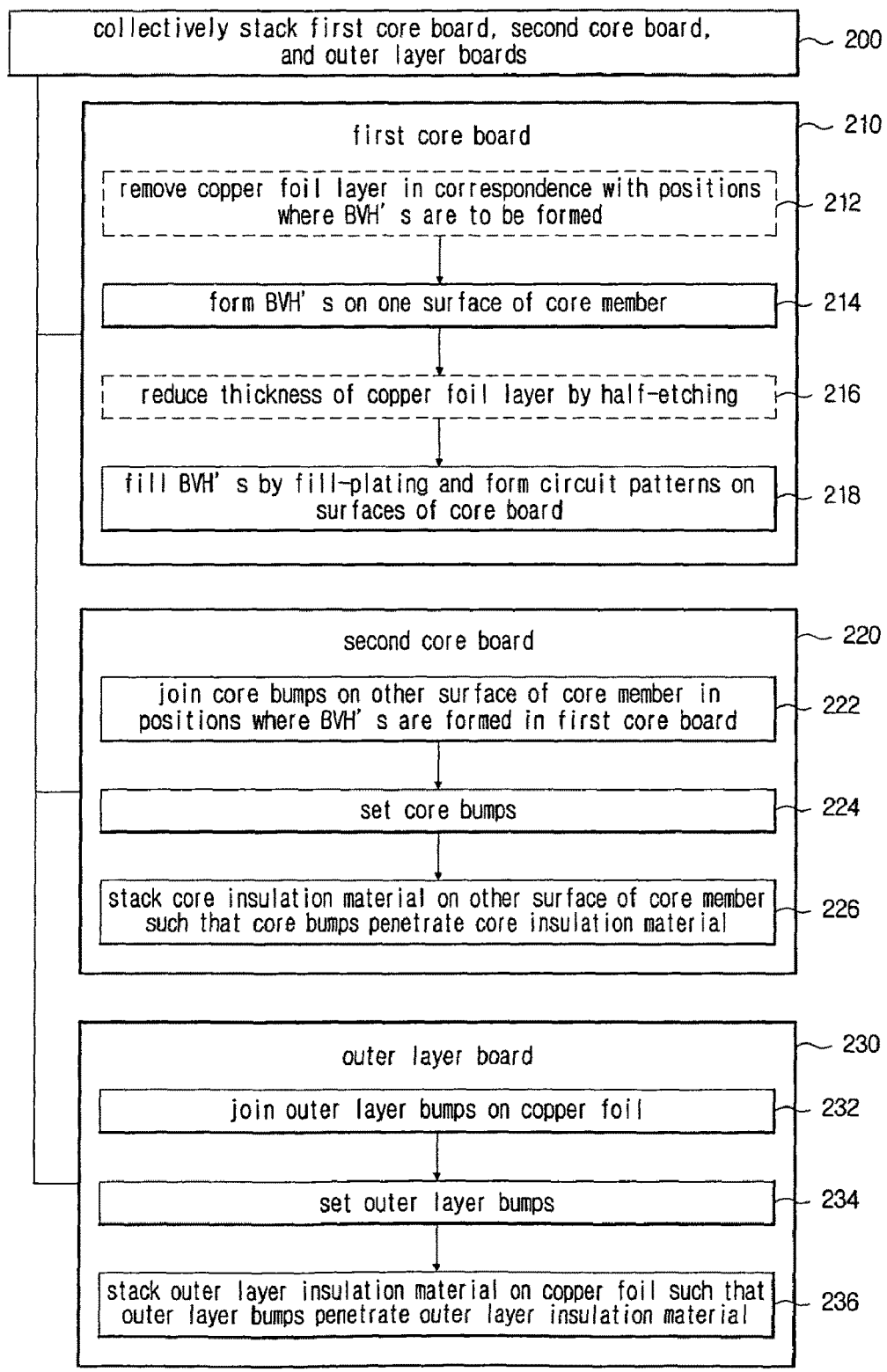
FIG. 3 is a flowchart illustrating a method of manufacturing a printed circuit board using paste bumps according to another embodiment of the present invention.

FIG. 3 is a flowchart illustrating a method of manufacturing a printed circuit board using paste bumps according to another embodiment of the present invention.

The method of manufacturing a multilayer printed circuit board according to the present invention is not limited to stacking paste bump boards on a single core board, but includes the case of collectively stacking a plurality of core boards and paste bump boards. The description below will illustrate as an example the case of manufacturing a multilayer printed circuit board by collectively stacking two core boards and paste bump boards, which are the outer layer boards.

That is, in manufacturing a printed circuit board by collectively stacking a first core board, a second core board, and paste bump boards, which are the outer layer boards (200), first, the first core board is formed (210) by forming BVH's on one surface of the core member (214), and filling the BVH's by fill-plating and forming a circuit pattern on the surface of the core board (218).

As described earlier, it is desirable to use a copper clad laminate (CCL) for the core member, in which case it is desirable to remove the portions of the copper foil layer where the BVH's are to be formed (212) to create window portions before forming the BVH's. Also, before forming the BVH's and plating, the thickness of the copper foil layer may be reduced by half-etching (216), to enable the implementation of micro circuits.

Next, the second core board is formed (220), which is for collectively stacking with the first core board to form the multilayer printed circuit board, by joining paste bumps to a board in the same form as the first core board.

That is, the second core board is formed by joining core bumps, in correspondence with the positions on the first core board where the BVH's are formed, on the surface of the core member opposite the surface on which BVH's are formed (222) and by setting the core bumps (224). It is efficient in terms of manufacture to form the core bumps in the same manner as for the paste bumps described earlier. It is apparent, however, that the present invention is not necessarily limited to the case in which the core bumps and the paste bumps are the same.

After joining the core bumps, a core insulation material is stacked on the other surface of the core member such that the core bumps penetrate the insulation material (226), as for the case of the paste bump board described earlier, to complete the second core board. By thus stacking beforehand the insulation material that is to be filled between the first and second core boards, a speedy manufacture by collective stacking may be achieved.

Lastly, the outer layer boards are formed (230), which have the same form as the paste bump boards described earlier. An outer layer board is formed by joining outer layer bumps on a copper foil (232), setting the outer layer bumps (234), and stacking an outer layer insulation material onto the copper foil such that the outer layer bumps penetrate the insulation material (236). Detailed descriptions on the outer layer boards will not be provided.

In the process of stacking the second core board on the first core board, the core bumps are filled in the dimples of the BVH's formed in the first core board, by which the core bumps and the plating layer filled in the BVH's of the first core board are electrically connected.

Since the core bumps are joined on the second core board in positions where the BVH's are formed, when the first core board, second core board, and outer layer boards are stacked in order, the plating layer of the first core board are electrically connected with the core bumps, the core bumps are connected to the plating layer filled in the BVH's of the second core board, and the plating layer filled in the BVH's of the second core board is electrically connected with the outer layer bumps.

In other words, the plating layers filled in the BVH's of the first core board and second core board are electrically connected by the core bumps and outer layer bumps to form IVH's (interstitial via holes). Such an all-layer IVH structure formed according to the present embodiment provides a structure that is generally more stable, compared to that formed by the stacking of conventional paste bump boards, since the intermediate core boards and plating layers provide sufficient structural strength.

In order for the paste bumps to be filled in the dimples of the plating layer and be electrically connected, the printed circuit board according to an embodiment of the invention is formed by stacking the first core board and second core board such that the core bumps are aligned in the positions of the dimples, and then pressing the outer layer boards, which are paste bump boards. It is apparent that the number of core boards may vary according to the number of circuit pattern layers required.

Figure 4:
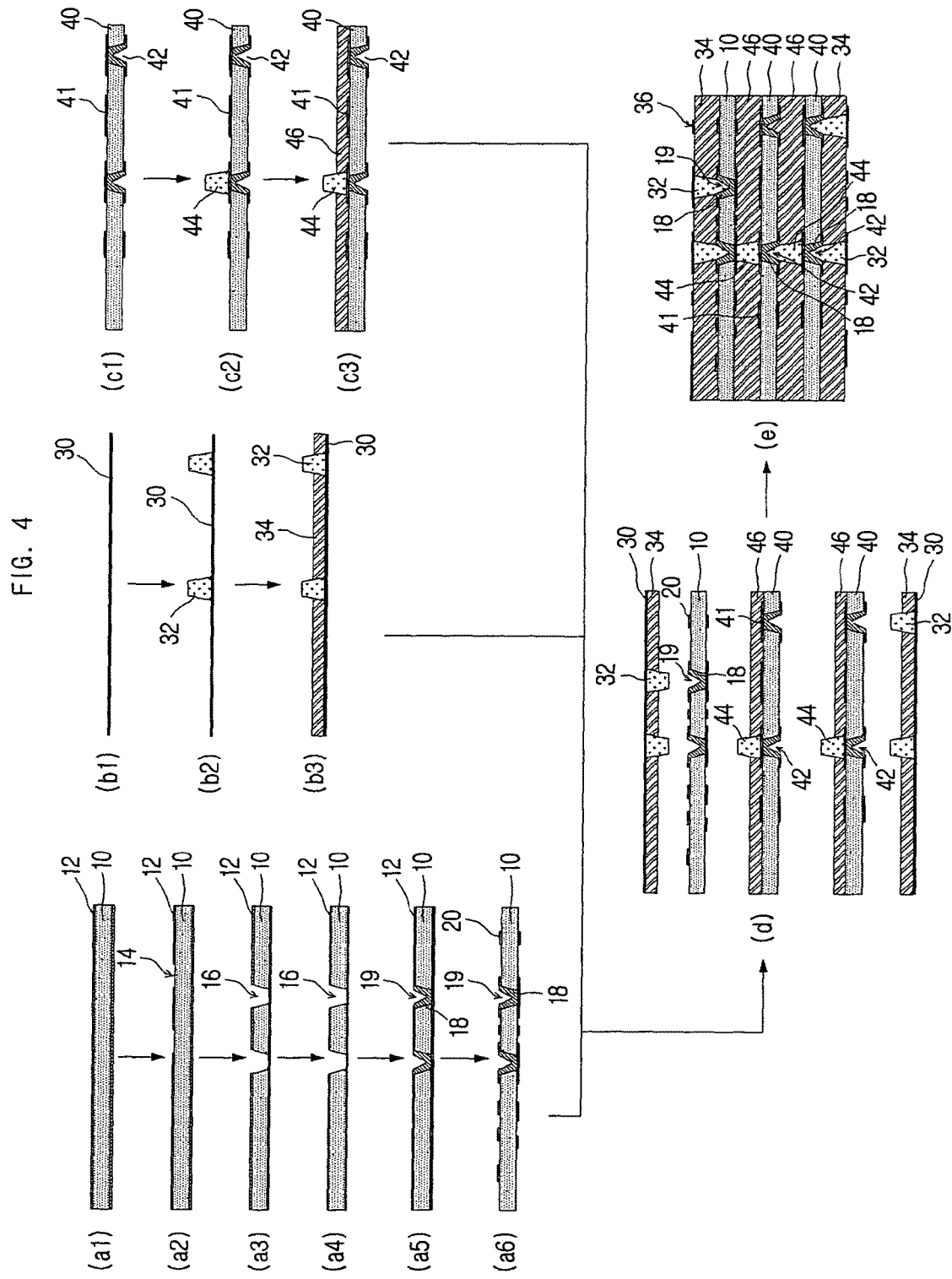

FIG. 4 is a flow diagram illustrating a process of manufacturing a printed circuit board using paste bumps according to an embodiment of the present invention. In FIG. 4 are illustrated core members 10, 40, copper foil layers 12, window portions 14, BVH's 16, plating layers 18, dimples 19, 42, circuit patterns 20, 41, copper foils 30, paste bumps 32, 44, insulation material 34, 46, and outer layer circuits 36.

As illustrated in FIG. 4, the multilayer printed circuit board according to the present embodiment is formed by concurrently manufacturing the first core board, second core boards, and paste bump boards, and then collectively stacking afterwards. The descriptions are provided for each unit process.

(1) Manufacturing Process for the First Core Board

To manufacture a first core board, which does not have paste bumps, a core member 10, such as a copper clad laminate (CCL), etc., is prepared as in (a1) of FIG. 4, to which pre-processing procedures such as baking, etc., have been applied. Then, as in (a2) of FIG. 4, the portions of the copper foil layer 12 where the BVH's 16 are to be formed are removed to form window portions 14.

However, it is not necessary that the invention include a process of forming window portions 14, and as will be described later, while using CO2 laser to process BVH's 16 requires removing portions of the copper foil layer 12 to form window portions 14, using YAG laser to process BVH's 16 does not require forming separate window portions 14, since it is able to process the copper foil layer 12 as well. As such, it is to be appreciated that various BVH forming processes may be applied, within a scope apparent to those skilled in the art.

As in (a3) of FIG. 4, the BVH's are processed by means of mechanical drilling or laser (CO2 or YAG laser) drilling.

Before plating in the BVH's 16, the thickness of the copper foil layer 12 is reduced by half-etching, as in (a4) of FIG. 4. This is to prevent difficulties in implementing micro circuits caused by an increase in the thickness of the copper foil layer 12 due to the plating.

As in (a5) of FIG. 4, the BVH's 16 formed on the core member 10 are fill-plated to form a plating layer 18. The fill-plating applied in the BVH's 16 is a process for rendering conductivity to the holes processed in the core member 10, which is of an insulating material. With typical fill-plating, the BVH's 16 are not completely filled, but instead, the plating layer 18 is formed in accordance with the shape of the BVH's 16, to form dimples 19 having the shape of concave grooves in the opening portions of the BVH's 16.

In prior art, the dimples 19 formed when fill-plating was applied to BVH's 16 acted as obstacles to the electrical connection between the plating layer 18 and other circuit pattern layers. In embodiments of the present invention, the dimples 19 created by fill-plating are filled in with the paste bumps 32 to improve the reliability of electrical connection, whereby an effect of 'dimple coverage' may be obtained.

As in (a6) of FIG. 4, a circuit pattern forming process, including exposing, developing, etching, and inspecting, is applied to the copper foil layer 12 on the surface of the core member 10 to form circuit patterns 20. With the completion of the circuit pattern forming process, the resulting board is transported for a lay-up process, which will be described later.

(2) Manufacturing Process for the Paste Bump Board

On a copper foil 30, prepared as in (b1) of FIG. 4, conductive paste such as silver paste, etc., is printed as in (b2) of FIG. 4, to form paste bumps 32. To enhance the efficiency of the collective stacking, an insulation material 34 such as prepreg, etc., is stacked on the copper foil 30 as in (b3) of FIG. 4. During this process, the paste bumps 32 formed on the copper foil 30 penetrate the prepreg to be exposed through the surface of the insulation material 34.

By thus having the paste bumps 32 exposed through the surface of the insulation material 34, the dimples 19 are filled by the paste bumps 32 during the collective stacking. When the process of stacking the insulation material 34 is completed, the resulting board is transported for a lay-up process, which will be described later.

(3) Manufacturing Process for the Second Core Board

As in (c1) of FIG. 4, the core board manufactured by the manufacturing process for the first core board is prepared, and as in (c2) of FIG. 4, paste bumps 44 are printed using conductive paste on the surface opposite the dimples 42 of the portions where the plating layer 18 of the BVH's 16 is formed. The paste bumps 44 joined to the second core board are electrically connected with the dimples of another core board or with circuit patterns, while the dimples 42 of the plating layer formed on the second core board are filled by paste bumps joined to another core board or to a paste bump board.

As in the case of a paste bump board, an insulation material 46 such as prepreg, etc., is stacked on the second core board, as in (c3) of FIG. 4. During this process, the paste bumps 44 penetrate the prepreg to protrude out to the surface of the insulation material 46.

By thus having the paste bumps 44 exposed through the surface of the insulation material 46, the dimples 42 are filled by the paste bumps 44 during the collective stacking. When the process of stacking the insulation material 46 is completed, the resulting board is transported for a lay-up process, which will be described later.

(4) Lay-Up and Collective Stacking Process

As in (d) of FIG. 4, a lay-up process is performed for the first core board, second core boards, and paste bump boards, such that the positions of the paste bumps are aligned with the positions of the dimples 19 of the plating layer 18, and the boards collectively stacked as in (e) of FIG. 4 are pressed together to manufacture the multilayer printed circuit board. A conventional build-up process of prior art may be applied to the ensuing process of forming outer layer circuits 36 on the printed circuit board.

As illustrated in (d) and (e) of FIG. 4, several first core boards or second core boards may be stacked to obtain a required number of circuit pattern layers.

FIG. 5 is a cross-sectional view of a printed circuit board using paste bumps according to an embodiment of the present invention. In FIG. 5 are illustrated core members 10, plating layers 18, dimples 19, circuit patterns 20, paste bumps 32, insulation materials 34, and outer layer circuits 36.

In the multilayer printed circuit board according to an embodiment of the invention, BVH's are formed in the core board and a plating layer 18 is filled inside, and paste bump boards are stacked collectively to fill the dimples 19 formed in the plating layers 18 with the paste bumps 32 and implement electrical connections with the plating layers 18, consequently forming an all-layer IVH structure composed of plating layers 18 and paste bumps 32.

That is, the multilayer printed circuit board according to an embodiment of the invention comprises a core board such as a copper clad laminate, etc., BVH's formed in the core board, plating layers 18 filled in the BVH's, and paste bump boards stacked on the core board, where a paste bump board is formed by printing and setting paste bumps 32 on a copper foil 30, and then stacking an insulation material 34 so that the paste bumps 32 penetrate the insulation material 34.

As described earlier, dimples 19 are formed in the plating layer 18 filled in the BVH's by typical fill-plating, and such dimples 19 act as obstacles to the interlayer electrical connection between circuit patterns 20. In embodiments of the present invention, however, paste bump boards having paste bumps 32 formed corresponding with the positions of the dimples 19 are stacked on the core board, so that the paste bumps 32 fill the dimples 19, and become electrically connected with the plating layer 18.

In stacking the insulation material 34 on the paste bump board, the strength of the paste bumps 32 must be greater than that of the insulation material 34 to allow the paste bumps 32 to penetrate the insulation material 34, while the strength of the paste bumps 32 must be lower than that of the plating layer 18 for the paste bumps 32 to fill the dimples 19 and form an electrical connection with the plating layer 18. Here, during the process of pressing and stacking the paste bump boards onto the core boards, the paste bumps 32 are deformed in shape according to the shape of the dimples 19, and the paste bumps 32 are filled in the dimples 19.

After the completion of the collective stacking, a typical circuit pattern forming process is applied on the copper foils 30, i.e. the outermost layers, of the multilayer printed circuit board to form outer layer circuits 36.

Meanwhile, embodiments of the present invention include a multilayer printed circuit board, in which one or more additional core boards are further included between the core board and the paste bump boards to provide a desired number of circuit pattern layers. In this case, the additional core boards (hereafter referred to as "extra boards"), as with the core board described earlier, each have BVH's formed on one surface with a plating layer 18 filled in the BVH's, and have paste bumps 32 joined on the surface opposite the dimples 19 of the plating layer 18 in the positions where the BVH's are formed.

In stacking the extra boards thus formed on the core board, the paste bumps joined onto the extra boards fill the dimples 19 of the core board and become electrically connected with the plating layer 18. By stacking another extra board or a paste bump board on the extra board, the dimples 19 formed in the plating layer 18 of the extra board is filled with paste bumps 32 to be electrically connected with the plating layer 18 of the extra board.

That is, when one or more extra boards are placed between the core board and the paste bump boards, the plating layer 18 and paste bumps 32 of each board are connected to generally form all-layer IVH's. Since such IVH's have plating layers 18 arranged intermediately, they are structurally more stable, compared to all-layer IVH's formed by stacking only paste bump boards.

Figure 6:
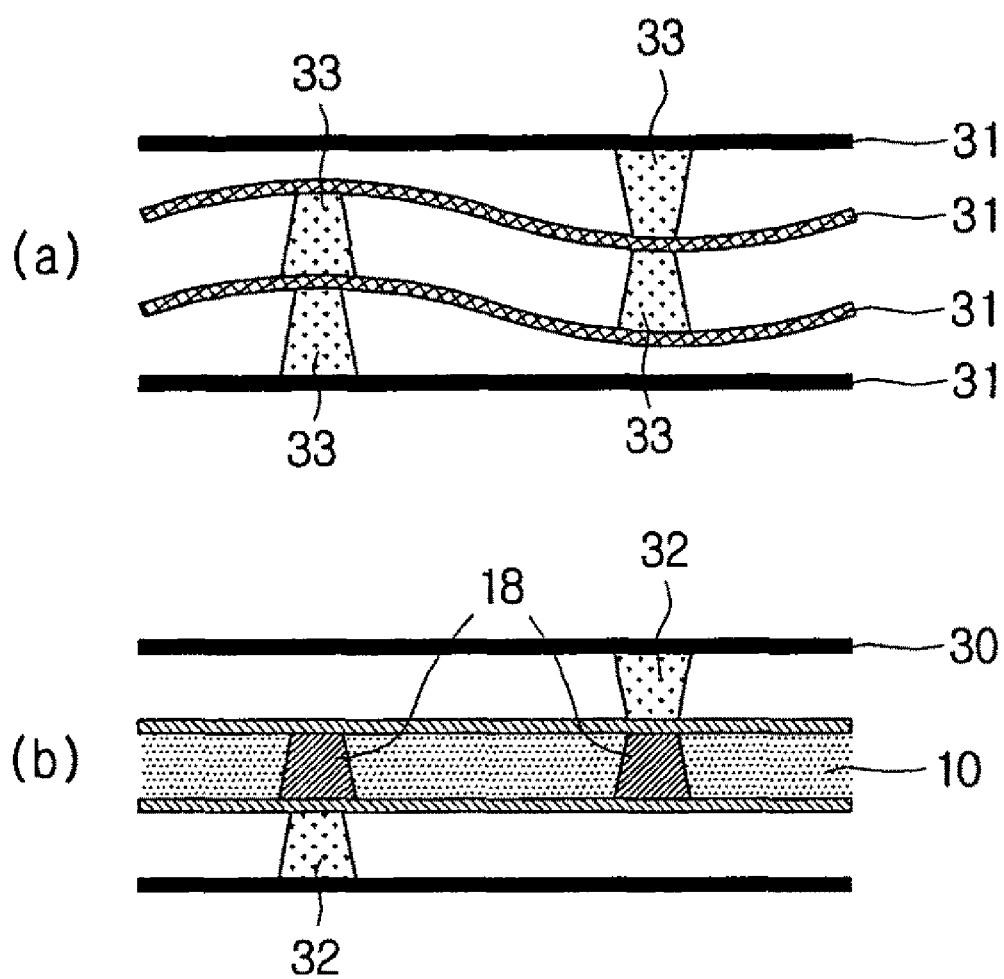

FIG. 6 shows cross-sectional views comparing the respective structural stability of a printed circuit board using paste bumps according to an embodiment of the present invention and a printed circuit board using paste bumps according to prior art. In FIG. 6 are illustrated core boards 10, a plating layer 18, copper foils 30, 31, and paste bumps 32, 33.

As shown in (a) of FIG. 6, for an all-layer IVH formed by stacking only paste bump boards, the entire structure is formed only with copper foils 31 and insulation material, and the insufficient strength in the inner core portions results in a structurally unstable composition. This may cause problems such as short circuits between the paste bumps 33 and copper foils 31 when a high-voltage, high-frequency current flows through the printed circuit board.

On the other hand, an all-layer IVH according to an embodiment of the invention, as shown in (b) of FIG. 6, has a structurally stable composition, since the core boards 10 and the plating layers 18 from the fill-plating provide sufficient structural strength. The paste bumps 32 fill the dimples to connect with the plating layer, and the copper foils 30 provide thin copper foil layers which enable the forming of minute outer layer circuits 36.

Figure 7:
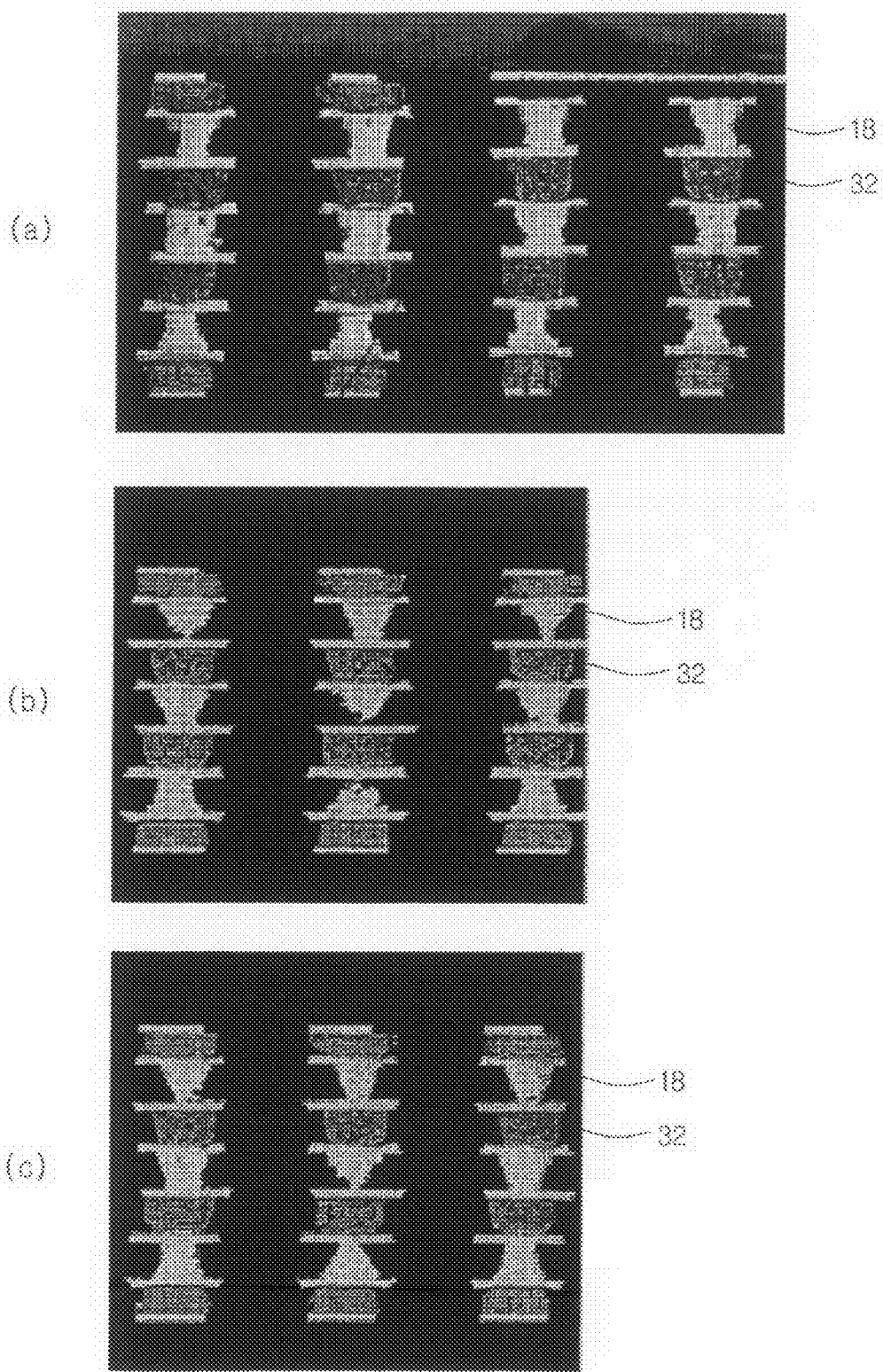

FIG. 7 shows photographs illustrating all-layer IVH structures of a printed circuit board using paste bumps according to an embodiment of the present invention, FIG. 8 shows photographs illustrating all-layer IVH structures of a printed circuit board using paste bumps according to another embodiment of the present invention, and FIG. 9 shows photographs illustrating dimple coverage in a printed circuit board using paste bumps according to an embodiment of the present invention. In FIGS. 7 to 9 are illustrated plating layers 18 and paste bumps 32.

FIGS. 7 and 8 show stable all-layer IVH's, in which all of the layers in the cross section are electrically connected, having plating layers 18 on a plurality of core boards connected respectively by paste bumps 32, and paste bump boards stacked as the outer layers.

A dimple is formed, which is a concave portion formed due to the shape of a BVH, in the plating layer 18 filled in each of the BVH's of the core board, and when boards having paste bumps 32 are stacked collectively as in the present embodiment, the paste bumps 32 are deformed in accordance with the shape of the dimples to be electrically connected with the plating layer 18.

Since the paste bumps 32 are thus filled in the dimples and are electrically connected with the plating layer 18, the reliability is improved of interlayer electrical connection between circuit patterns 20, and 'dimple coverage' is attained as a solution to the problem of difficulty in electrical connection caused by dimples.

Figure 11:
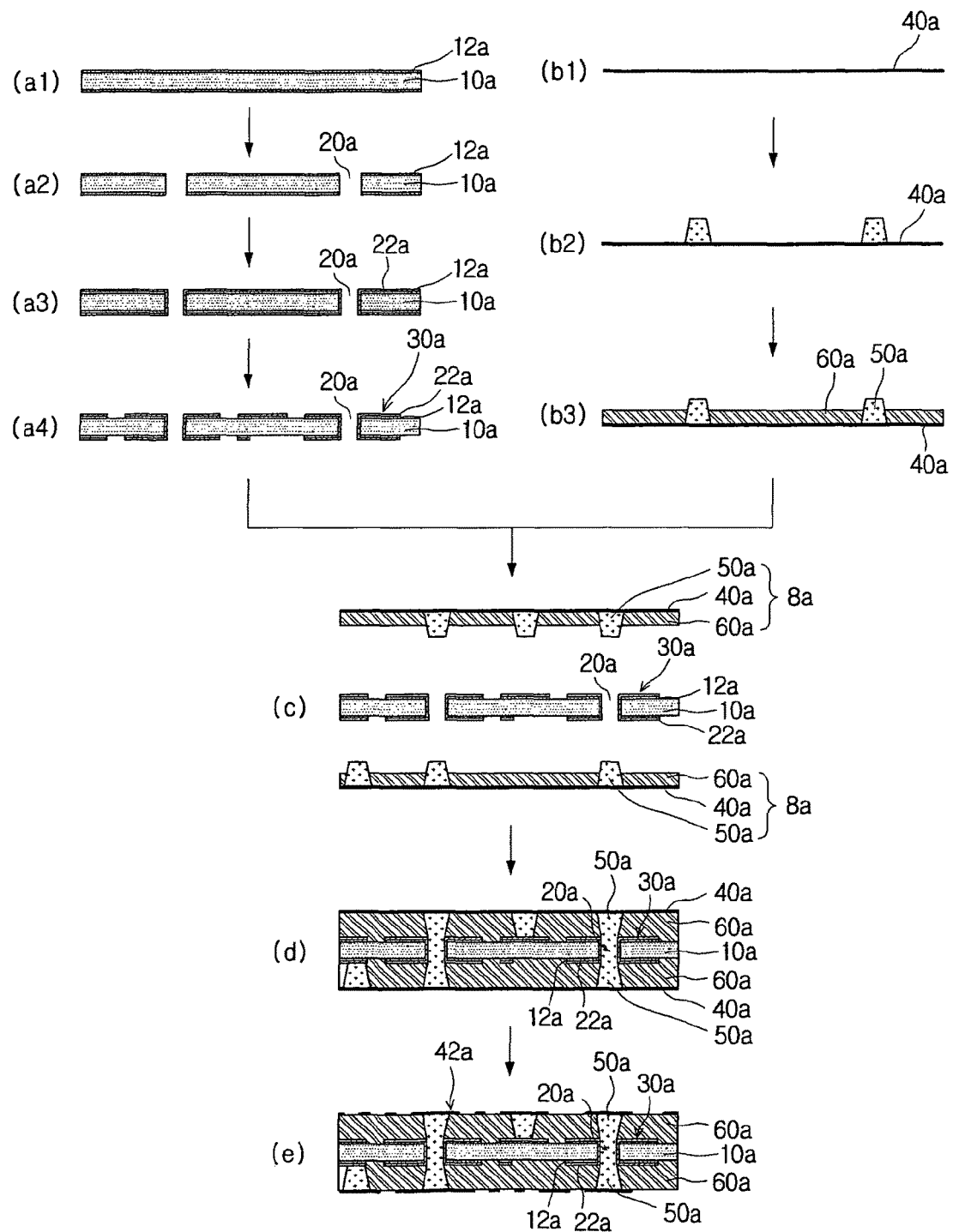

FIG. 10 is a flowchart illustrating a method of manufacturing a printed circuit board using paste bumps according to another embodiment of the present invention, and FIG. 11 is a flow diagram illustrating a process of manufacturing a printed circuit board using paste bumps according to another embodiment of the present invention. In FIG. 11 are illustrated paste bump boards 8a, a core board 10a, copper foil layers 12a, via holes 20a, plating layers 22a, inner layer circuits 30a, copper foils 40a, outer layer circuits 42a, paste bumps 50a, and insulation material 60a.

In order to improve the efficiency of heat release in a printed circuit board using paste bump boards 8a having paste bumps 50a formed beforehand on copper foils 40a, in an embodiment of the present invention, a core board 10a such as shown in (a1) of FIG. 11 has portions thereof perforated as in (a2) of FIG. 11 to form via holes 20a (P100).

For increased efficiency in forming inner layer circuits 30a, it is advantageous to use a copper clad laminate (CCL) for the core board 10a. As the via holes 20a function not only as electrical connection means between interlayer circuit patterns but also as heat-releasing holes for releasing heat generated in the board, their size is determined in consideration of heat-releasing efficiency, and since they require a lower degree of precision than do IVH's or BVH's, they may be perforated using mechanical drilling.

Plating layers 22a are formed as in (a3) of FIG. 11 on the inner perimeters of the via holes 20a not only for interlayer electrical connection between circuit patterns but also for better heat conduction, to improve the efficiency of heat release. As such, the thickness of the plating layers 22a on the inner perimeters of via holes 20a used as heat-releasing holes is greater than that for other via holes 20a, in consideration of both electrical connection and heat conduction. However, methods of manufacturing a printed circuit board according to embodiments of the invention do not necessarily require plating layers 22a on the inner perimeters of the via holes 20a, and it is to be appreciated that other methods of electrical connection may be used within a scope apparent to those skilled in the art, such as of implementing interlayer electrical connection between circuit patterns by means of paste bumps 50a, etc, as will be described later.

During the process of plating the inner perimeters of the via holes 20a, plating layers 22a are formed also on the surfaces of the core board 10a, whereby the thickness of the circuit patterns is increased, which is unfavorable to implementing micro circuit patterns. In this case, the plating process may be omitted, as in an embodiment of the invention, with the inner layer circuits 30a formed only from the copper foil layers 12a on the surfaces of the core board 10a, to more readily implement micro circuit patterns. When the plating layers 22a are not formed on the inner perimeters of the via holes 20a, the interlayer electrical connection between circuit patterns is achieved by means of conductive paste bumps 50a filled in the via holes 20a.

Next, inner layer circuits 30a are formed on the surfaces of the core boards 10a (P110), as in (a4) of FIG. 11. A subtractive process may be applied in forming the inner layer circuits 30a, and when the plating process is omitted, as described earlier, more minute circuit patterns may be implemented.

Next, paste bump boards 8a are stacked onto surfaces of the core board 10a (P120), as shown in (c) of FIG. 11. A paste bump board 8a is a board in which paste bumps 50a have been printed beforehand on the surface of a copper foil 40a. To manufacture a paste bump board 8a, a copper foil 40a such as that shown in (b1) of FIG. 11 has paste bumps 50a printed in correspondence with the positions of the via holes 20a formed in the core board 10a (P122), as shown in (b2) of FIG. 11, after which the paste bumps 50a are set (P124).

Manufacturing the paste bump boards 8a separately and stacking them collectively on a core board 10a reduces the manufacturing process of the printed circuit board, and to render the collective stacking process even more efficient, insulation material 60a is stacked on the copper foils 40a having paste bumps 50a (P126), as in (b3) of FIG. 11.

As the paste bumps 50a are filled in the via holes 20a of the core board 10a from stacking the paste bump boards 8a on the core board 10a, as illustrated in (c) of FIG. 11, it is desirable that the thickness of an insulation material 60a stacked onto the copper foils 40a be less than the height of the paste bumps 50a so that the ends of the paste bumps 50a are exposed through the surface of the insulation material 60a.

It is advantageous for the paste bumps 50a printed and set on a copper foil 40a to have a strength lower than that of the core board 10a but greater than that of the insulation material 60a. Thus, when the insulation material 60a is stacked on the copper foil 40a, the paste bumps 50a penetrate the insulation material 60a to be exposed through the surface of the insulation material 60a without being deformed.

Also, to prevent damages on the core board 10a from the paste bumps 50a during the process of stacking paste bump boards 8a onto the core board 10a and pressing such that the paste bumps 50a fill in the via holes 20a, it is advantageous for the strength of the paste bumps 50a be lower than the strength of the core board 10a.

In this case, when the positions of the paste bumps 50a are aligned with the positions of the via holes 20a and the paste bump boards 8a are pressed onto the core board 10a, the form of the paste bumps 50a is deformed in accordance with the form of the via holes 20a in the core board 10a, to be filled inside the via holes 20a.

While silver paste is typically used as the material for the paste bumps 50a, it is to be appreciated that other types of paste may be used, within a scope apparent to those skilled in the art, in consideration of the strength, cost, and applicability of the paste.

Using conductive paste can further increase the efficiency of heat release through the via holes 20a filled in with the paste bumps 50a, and as described earlier, interlayer electrical connection may be implemented by the via holes 20a without forming plating layers 22a on the inner perimeters of the via holes 20a.

The amount of a paste bump 50a printed on a copper foil 40a is determined in correspondence with the size of a via hole 20a. This is to allow the paste bumps 50a to fill the via holes 20a formed in the core board 10a when stacking the paste bump board 8a on the core board 10a.

Stacking the paste bump boards 8a onto the surfaces of the core board 10a provides outer layer circuits 42a that are insulated from inner layer circuits 30a formed on the surfaces of the core board 10a, and since the interlayer connection between such circuit patterns are obtained through BVH's (blind via holes), it is desirable that the paste bumps 50a be formed to function as BVH's that electrically connect the inner layer circuits 30a and outer layer circuits 42a.

Here, the paste bumps 50a do not necessarily have to be formed in positions where there are via holes 20a, but may be formed in positions where electrical connection with an inner layer circuit 30a is required.

Next, as in (d) of FIG. 11, the paste bump boards 8a are stacked on both surfaces of the core board 10a. Stacking the paste bump boards 8a is achieved by aligning the paste bump boards 8a with the core board 10a, as in (c) of FIG. 11, and then pressing the paste bump boards onto both surfaces of the core board 10a (P130).

This allows the paste bumps 50a to fill in the via holes 20a such that the via holes 20a can function as heat-releasing holes. As described earlier, when plating layers 22a are not formed on the inner perimeters of the via holes 20a, the via holes 20a also function as IVH's that implement interlayer connection between circuit patterns. Thus, embodiments of the invention may provide all-layer IVH's that span the entire cross section, whereby the interlayer connection paths between circuit patterns may be reduced, to the effect of decreased inductance noise.

Lastly, as in (e) of FIG. 11, outer layer circuits 42a are formed on the copper foils 40a, i.e. the surfaces of the paste bump boards 8a (P140). As with the inner layer circuits 30a, a typical additive process or subtractive process may be applied to forming the outer layer circuits 42a.

FIG. 12 is a cross-sectional view of a printed circuit board using paste bumps according to another embodiment of the present invention. In FIG. 12 are illustrated are illustrated a core board 10a, copper foil layers 12a, via holes 20a, plating layers 22a, inner layer circuits 30a, copper foils 40a, outer layer circuits 42a, paste bumps 50a, and insulation materials 60a.

The printed circuit board according to the present embodiment is formed by pressing paste bump boards on both sides of a core board 10a, which has inner layer circuits 30a formed on its surfaces and via holes 20a perforated, where a paste bump board is formed by joining paste bumps 50a on a copper foil 40a in correspondence with the positions of the via holes 20a and stacking an insulation material 60a onto the paste bumps 50a such that the paste bumps 50a penetrate the insulation material 60a to be exposed through the surface of the insulation material 60a.

It is desirable to use a copper clad laminate (CCL) for the core board 10a, to increase efficiency in forming circuit patterns. Electrical connection is implemented for the circuit patterns formed on both surfaces of the core board 10a, by coating metal layers on the inner perimeters of typical via holes 20a by plating. As described earlier, since the plating layers 22a formed on the inner perimeters of the via holes 20a not only provide electrical connection but also transfer heat generated in the board to be released to the exterior, the coating has a greater thickness compared to typical plating thicknesses.

However, the invention is not limited to forming plating layers 22a on the inner perimeters of the via holes 20a, and the effects of electrical connection and heat release can both be obtained by having the paste bumps 50a fill in the via holes 20a.

The paste bump board is formed by printing and setting paste bumps 50a beforehand on the copper foil 40a, and then stacking the insulation material 60a such that the paste bumps 50a penetrate the insulation material 60a to be exposed through the surface of the insulation material 60a. To this end, the paste bumps 50a are formed such that the strength of the set paste bumps 50a is greater than the strength of the insulation material 60a.

Silver paste is typically used for the paste bumps 50a, and the amount of a paste bump 50a printed on the copper foil 40a is determined in correspondence with the size of the via hole 20a formed in the core board 10a. This is to allow the paste bumps 50a to fill the via holes 20a when the paste bump boards are stacked onto the core board 10a.

In stacking the paste bump boards on the core board 10a such that the paste bumps 50a fill in the via holes 20a, it is desirable that the strength of the set paste bumps 50a be lower than that of the core board 10a. Thus, during the process of stacking the paste bump boards onto the core board 10a, the paste bumps 50a are deformed according to the shape of the via holes 20a and are filled in the via holes 20a without causing damages to the core board 10a.

After stacking the paste bump boards, outer layer circuits 42a are formed on the copper foils 40a of the paste bump boards, i.e. the surfaces of the printed circuit board. As the paste bumps 50a also function as BVH's that electrically connect an inner layer circuit 30a and an outer layer circuit 42a, they are formed in a corresponding shape.

To readily and inexpensively manufacture a multilayer printed circuit board through a collective stacking process by pressing on paste bump boards, the paste bump boards are stacked on both surfaces of the core board 10a. This is implemented by aligning the positions of the paste bumps with the positions of the via holes 20a in the core board 10a and then pressing on the paste bump boards.

FIG. 13 is a cross-sectional view of a printed circuit board using paste bumps according to another embodiment of the present invention. In FIG. 13 are illustrated are illustrated a core board 10a, copper foil layers 12a, via holes 20a, plating layers 23a, inner layer circuits 30a, copper foils 40a, outer layer circuits 42a, paste bumps 50a, and insulation materials 60a.

As described earlier, plating layers 23a are formed on the inner perimeters of the via holes 20a in the core board 10a for the interlayer electrical connection between circuit patterns and for releasing heat generated in the board, etc., while the remaining spaces are filled by the paste bumps 50a.

In FIG. 13, the thickness of the plating layers 23a formed on the inner perimeters of the via holes 20a have been adjusted, unlike in FIG. 12, so that the paste bumps 50a better fill the via holes 20a. That is, the thickness of the plating layers 23a is increased along a depth-wise direction from the opening of the via holes 20a, such that the shape of the via holes 20a is in correspondence with the shape of the paste bumps 50a.

For example, if the paste bumps 50a are formed in a cone shape, the thickness of the plating layers 23a is increased along the depth of the via holes 20a such that the via holes 20a are formed in the shape of a funnel, in correspondence with the shape of the paste bumps 50a, whereby the degree to which the paste bumps 50a are deformed and filled in the via holes 20a is improved.

If the paste bump boards are pressed onto both surfaces of the core board 10a, as in embodiments of the present invention, increasing the thickness of the plating layers 23a along a depth-wise direction from the openings, such that the interiors of the via holes 20a have a shape similar to an hourglass, may improve the filling of the paste bumps 50a.

According to the present invention composed as set forth above, a structurally stable all-layer IVH structure can be implemented due to increased strength in the BVH's of the plated core boards, the manufacture time can be reduced due to parallel processes and collective stacking, implementing micro circuits can be made easy due to the copper foils of the paste bump boards stacked on the outermost layers, the manufacture costs can be reduced as certain plating and drilling processes may be omitted, the interlayer connection area is increased between circuit patterns for improved connection reliability, and dimple coverage can be obtained.

Also, by using paste bumps to fill the via holes formed in the core boards, the heat-releasing effect is improved, and as the interlayer electrical connection paths between circuit patterns are made shorter due to the implementation of an all-layer IVH stacking structure, induction noise is reduced.

In addition, since the multilayer printed circuit board is manufactured by collectively stacking paste bump boards, the process is simplified, the lead time is decreased, and the manufacture cost is reduced, and since the outer layer circuits are formed after stacking paste bump boards each of which include a copper foil layer, the process of plating the outer layers may be omitted, with a subtractive process applied directly on the copper foil layer to form more minute circuit patterns.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board using paste bumps, the printed circuit board comprising:
    a core board;
    at least one via hole formed by perforating a portion of the core board;
    an inner layer circuit formed on at least one surface of the core board;
    a paste bump board, formed by printing at least one paste bump on a copper foil, setting the at least one paste bump, and afterwards stacking an insulation material on the copper foil for the at least one paste bump to penetrate the insulation material, and stacked on a surface of the core board; and
    an outer layer circuit formed on a surface of the paste bump board,
    wherein the at least one paste bump is joined in correspondence with a position of the at least one via hole, and the at least one via hole is filled by the at least one paste bump such that the core board radiates heat to an outside of the paste bump board through the at least one paste bump,
    an amount of the at least one paste bump is determined in correspondence with a size of the at least one via hole,
    a plating layer is formed on an inner perimeter of the at least one via hole such that the inner layer circuit and the outer layer circuit are electrically connected by the plating layer, and
    a thickness of the plating layer increases along its depth from an opening of the at least one via hole.

2. The printed circuit board of claim 1, wherein the core board is a copper clad laminate (CCL).

3. The printed circuit board of claim 1, wherein the plating layer has varying thickness along its depth from an opening of the via hole such that the at least one via hole is formed in a shape corresponding with a shape of the at least one paste bump.

4. The printed circuit board of claim 1, wherein the at least one paste bump includes silver paste.

5. The printed circuit board of claim 1, wherein the at least one paste bump has a strength lower than that of the plating layer and a strength greater than that of the insulation material.

6. The printed circuit board of claim 1, wherein the at least one paste bump is formed in a shape of a BVH (blind via hole) configured to electrically connect the inner layer circuit and the outer layer circuit.

7. The printed circuit board of claim 1, wherein the paste bump board is stacked on both surfaces of the core board.

* * * * *